US008599520B1

(12) United States Patent
Liu et al.

(10) Patent No.: US 8,599,520 B1
(45) Date of Patent: Dec. 3, 2013

(54) METHOD AND SYSTEM FOR PROVIDING A READ TRANSDUCER HAVING AN ADAPTIVE READ SENSOR TRACK WIDTH

(75) Inventors: Feng Liu, San Ramon, CA (US);
Laurence L. Chen, Hayward, CA (US);
Yimin Guo, San Jose, CA (US);
Amritpal S. Rana, Union City, CA (US); Shaoping Li, San Ramon, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/332,275

(22) Filed: Dec. 20, 2011

(51) Int. Cl.
*G11B 5/127* (2006.01)
*G11B 5/39* (2006.01)

(52) U.S. Cl.
USPC ........................................ 360/324.1; 360/122

(58) Field of Classification Search
USPC ................................. 360/122, 313, 324–324.2
See application file for complete search history.

(56) References Cited

U.S. PATENT DOCUMENTS

| 4,841,398 | A | * | 6/1989 | Mowry | 360/327 |
| 5,654,854 | A | * | 8/1997 | Mallary | 360/327.3 |
| 6,433,973 | B1 | | 8/2002 | Li et al. | |
| 6,735,062 | B1 | | 5/2004 | Pokhil et al. | |
| 7,075,761 | B2 | | 7/2006 | Parker | |
| 8,339,752 | B1 | * | 12/2012 | Hattori et al. | 360/324.12 |
| 2003/0002229 | A1 | * | 1/2003 | Pinarbasi | 360/324.2 |
| 2005/0094470 | A1 | * | 5/2005 | Ikarashi | 365/222 |
| 2011/0050211 | A1 | * | 3/2011 | Gao et al. | 324/207.21 |
| 2011/0051294 | A1 | * | 3/2011 | Gao et al. | 360/313 |
| 2011/0134572 | A1 | * | 6/2011 | Qiu et al. | 360/313 |
| 2012/0229935 | A1 | * | 9/2012 | Song et al. | 360/313 |

FOREIGN PATENT DOCUMENTS

| JP | 62057111 A | * | 3/1987 |
| JP | 63184906 A | * | 7/1988 |

* cited by examiner

*Primary Examiner* — Will J Klimowicz

(57) ABSTRACT

A method and system provide a magnetic read transducer having an air-bearing surface (ABS). The magnetic transducer includes a first shield, a second shield, and a read sensor between the first shield and the second shield. The read sensor extends along a stripe height direction perpendicular to the ABS. A first portion of the read sensor at the ABS has a first width in a track width direction parallel to the ABS. A second portion of the read sensor is recessed from the ABS along the stripe height direction and has a second width in the track width direction. The second width is greater than the first width.

17 Claims, 5 Drawing Sheets

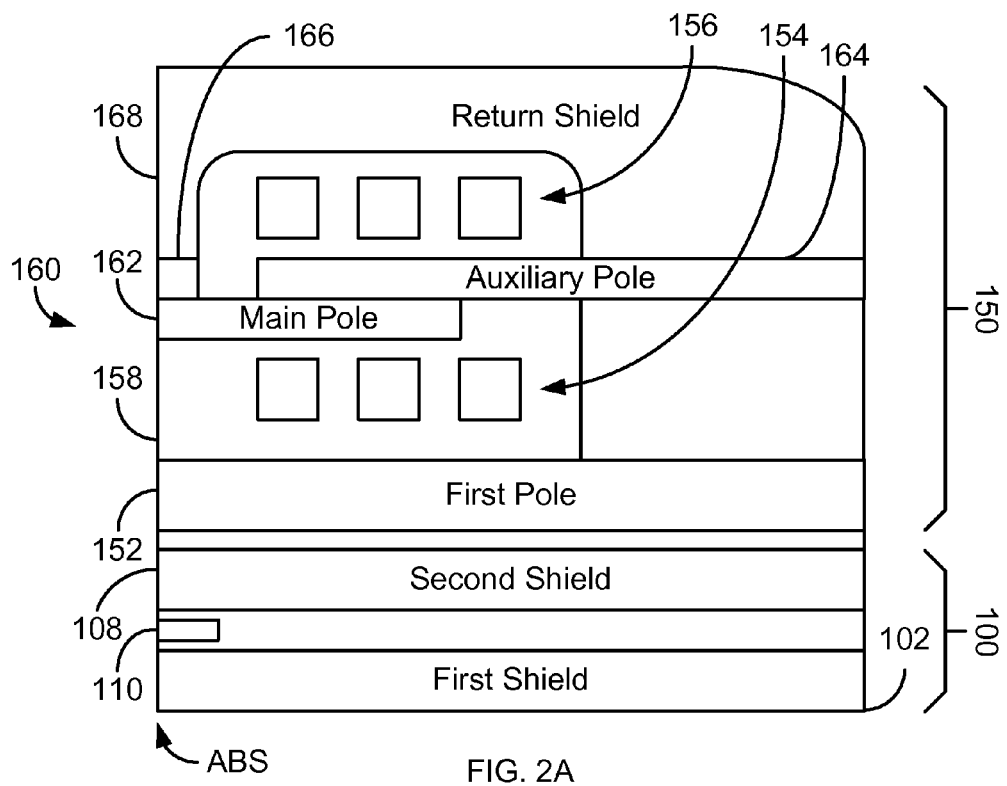
FIG. 2A
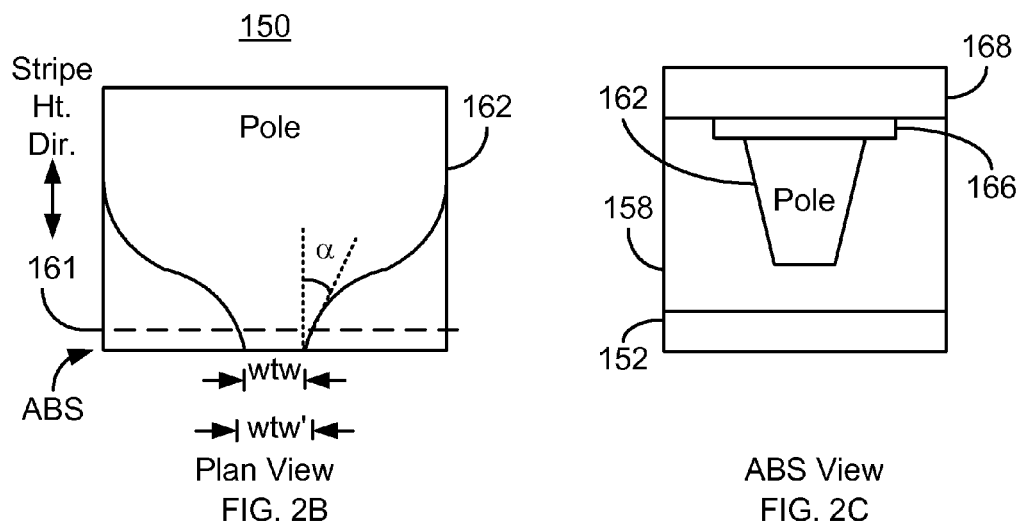
Plan View
FIG. 2B
ABS View
FIG. 2C

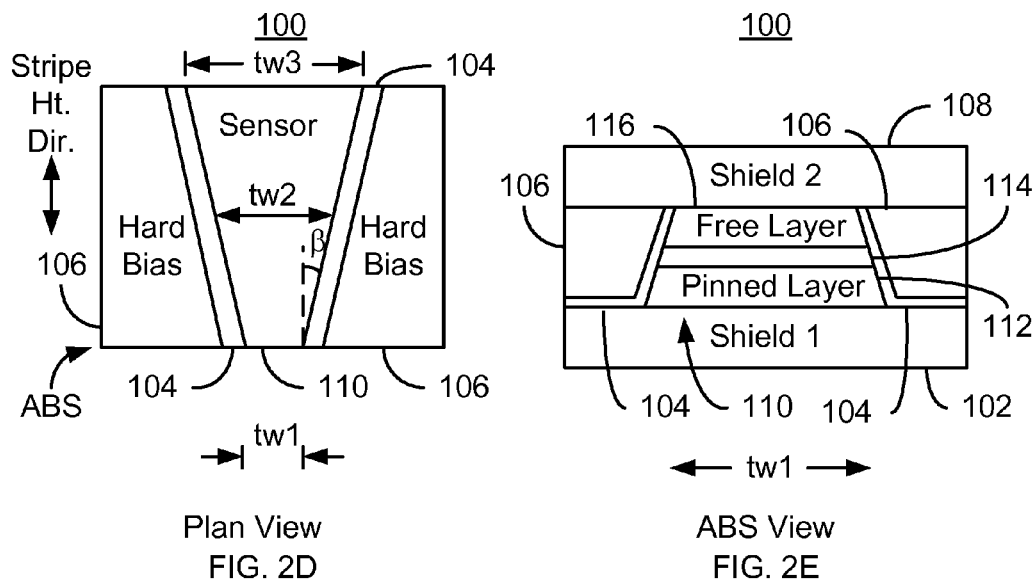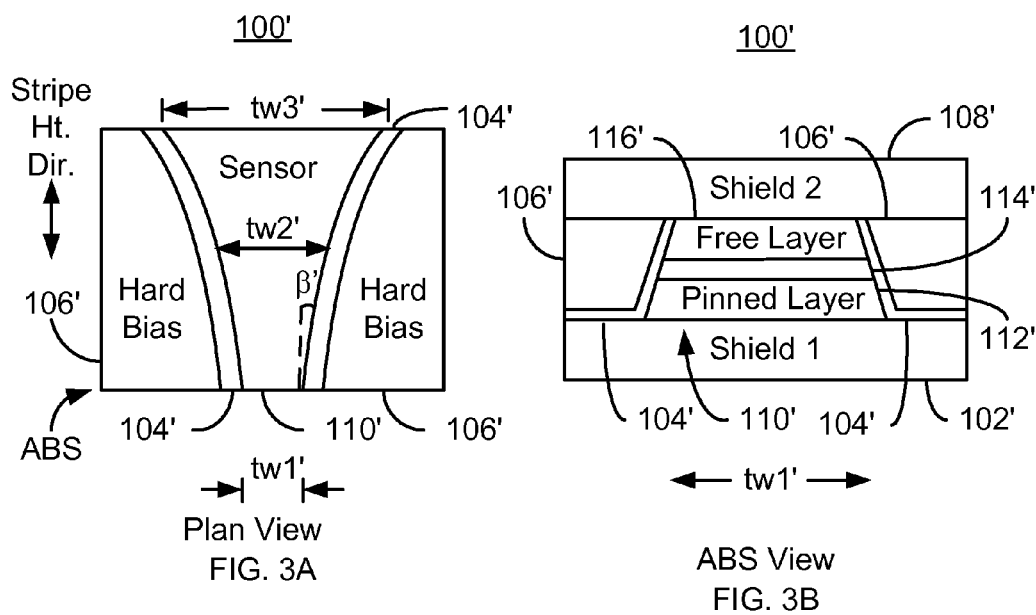

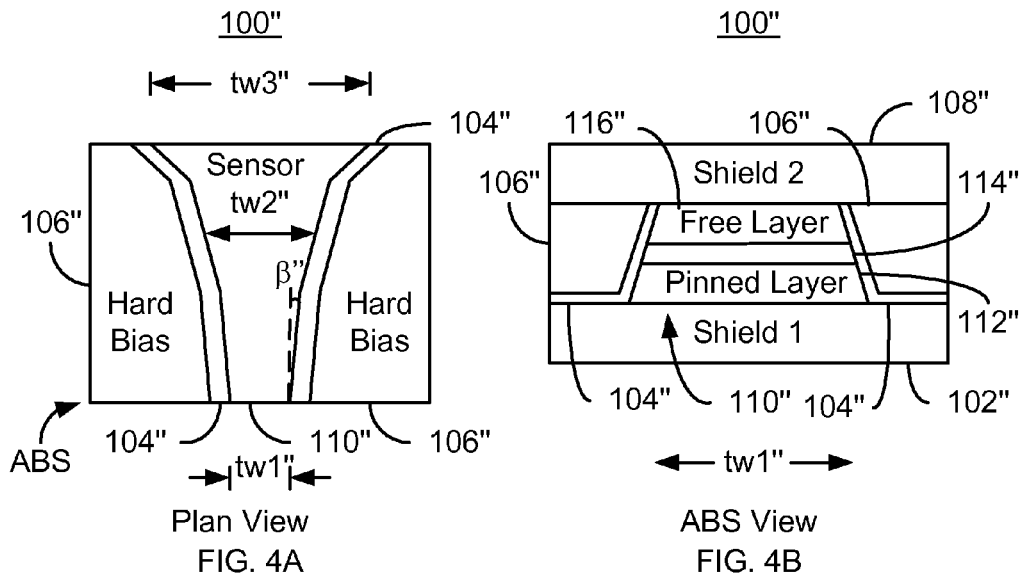
Plan View
FIG. 4A
ABS View
FIG. 4B
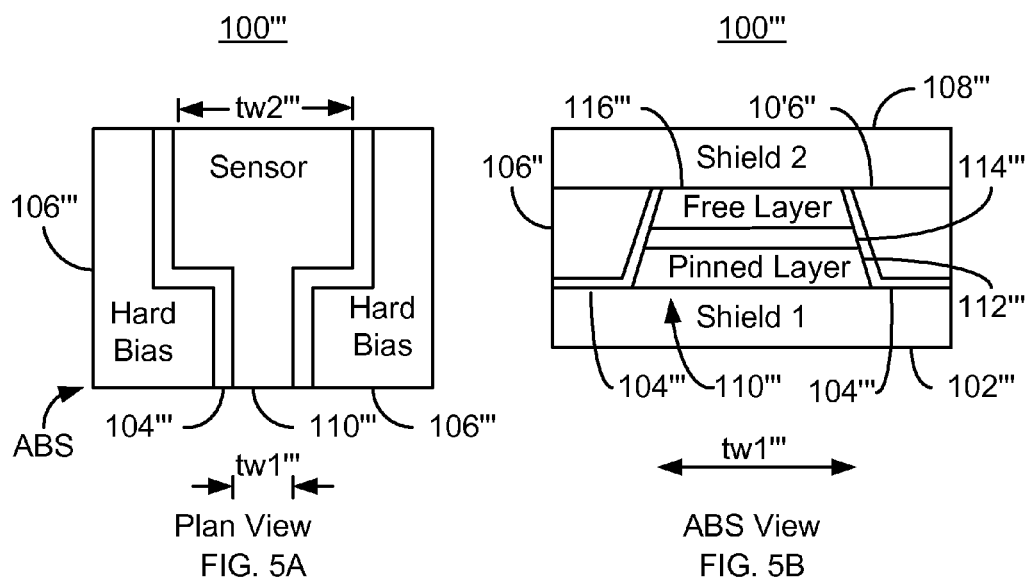
Plan View
FIG. 5A
ABS View
FIG. 5B

METHOD AND SYSTEM FOR PROVIDING A READ TRANSDUCER HAVING AN ADAPTIVE READ SENSOR TRACK WIDTH

BACKGROUND

FIGS. 1A-1B depicts an air-bearing surface (ABS) and plan views of a conventional read transducer used in magnetic recording technology applications. The conventional read transducer 10 includes shields 12 and 18, insulator 14, hard bias structures 16, and sensor 20. The read sensor 20 is typically a giant magnetoresistive (GMR) sensor or tunneling magnetoresistive (TMR) sensor.

The read sensor 20 includes an antiferromagnetic (AFM) layer 22, a pinned layer 24, a nonmagnetic spacer layer 26, and a free layer 28. Also shown is a capping layer 30. In addition, seed layer(s) may be used. The free layer 28 has a magnetization sensitive to an external magnetic field. Thus, the free layer 28 functions as a sensor layer for the magnetoresistive sensor 20. If the sensor 20 is to be used in a current perpendicular to plane (CPP) configuration, then current is driven in a direction substantially perpendicular to the plane of the layers 22, 24, 26, and 28. Conversely, in a current parallel to plane (CIP) configuration, then conductive leads (not shown) would be provided on the hard bias structures 16. The hard bias structures 16 are used to magnetically bias the free layer 28. The read sensor 20 has a track width, w, at the ABS. Further, as can be seen in FIG. 1B, the track width does not vary in the stripe height direction. In other words, the read sensor 20 has sidewalls that are substantially perpendicular to the ABS.

In operation, the conventional read sensor 20 responds to the field of a bit (not shown) on a media written by a write transducer (not shown). More specifically, the free layer 28 magnetic moment has a direction that is based on the field from the media. Based on the orientations of the magnetic moment of the free layer 28, the magnetoresistance of the conventional read sensor 20 changes. Thus, the magnetic transducer 10 may be used to read data written to a media by a write transducer.

Although the conventional transducer 10 functions, there are drawbacks. As magnetic recording technology has progressed, changes are made to the design of the heads incorporating the conventional read transducer 10 and sensor 20. For example, the magnetic write track width of a write transducer (not shown) has shrunk and may vary between devices. The conventional read transducer 10 may then need to be updated to account for such changes. Without such changes, the conventional read transducer 10 may not perform as desired.

Accordingly, what is needed is a system and method for improving the performance of a magnetic recording read transducer.

BRIEF SUMMARY OF THE INVENTION

A method and system provide a magnetic read transducer having an air-bearing surface (ABS). The magnetic transducer includes a first shield, a second shield, and a read sensor between the first shield and the second shield. The read sensor extends along a stripe height direction perpendicular to the ABS. A first portion of the read sensor at the ABS has a first width in a track width direction parallel to the ABS. A second portion of the read sensor is recessed from the ABS along the stripe height direction and has a second width in the track width direction. The second width is greater than the first width

BRIEF DESCRIPTION OF SEVERAL VIEWS OF THE DRAWINGS

FIGS. 2A-2E depicts various views of an exemplary embodiment of a portion of a magnetic recording read transducer as used in a magnetic read head.

FIGS. 3A-3B depicts plan and ABS views of another exemplary embodiment of a portion of a magnetic recording read transducer.

FIGS. 4A-4B depicts plan and ABS views of another exemplary embodiment of a portion of a magnetic recording read transducer.

FIGS. 5A-5B depicts plan and ABS views of another exemplary embodiment of a portion of a magnetic recording read transducer.

DETAILED DESCRIPTION OF THE PREFERRED EMBODIMENTS

Figure 1A:
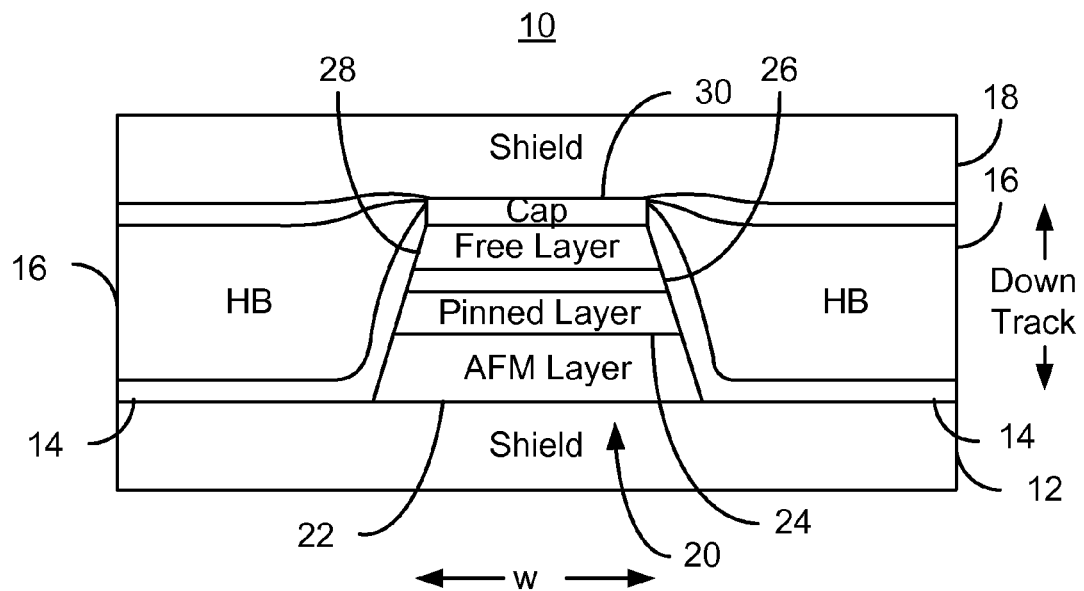
FIGS. 1A-1B depict ABS and plan views of a conventional magnetic recording read transducer.
Figure 1B:
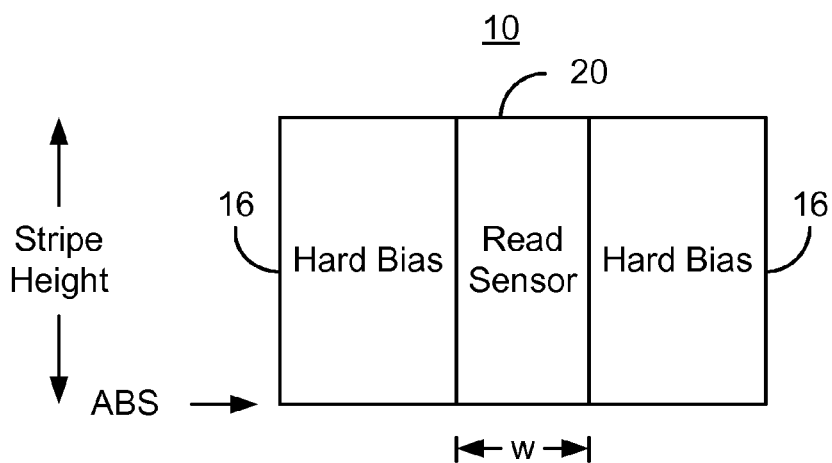

FIGS. 2A-2E depict various views of an exemplary embodiment of a portion of a magnetic read head. FIG. 2A depicts a side view of the head including a read transducer 100 and a write transducer 150. FIGS. 2B-2C depict plan and ABS views of the write transducer 150. FIGS. 2D-2E depict plan and ABS views of the read transducer 100. For clarity, FIGS. 2A-2E are not to scale. Although shown as part of a merged head, in other embodiments, the read transducer 100 may not be part of a stand-alone read head. The head of which the read transducer 100 and write transducer 150 are a part is part of a disk drive having a media, a slider and the head coupled with the slider. Further, only a portion of the components of the read transducer 100 and write transducer 150 are depicted.

The write transducer 150 includes poles 152 and 160, insulator 158, coils 154 and 156, return shield 158 and gap 166. The pole 160 includes a main pole 162 and an auxiliary pole 164. As can be seen in FIGS. 2B-2C, the main pole 162 has sidewalls having a reverse angle. As a result, the top of the main pole 162 is wider than its bottom. In addition, as can be seen in FIG. 2B, the nose of the pole 162 has a writer nose chisel angle, α. The value of the writer nose chisel angle may vary between designs. For example, some writer nose chisel angles may be only a few degrees, while others may be on the order of twenty-one degrees or more. Further, the sidewalls of the pole 162 are curved in the stripe height direction perpendicular to the ABS, the value of the writer nose chisel angle may vary. If the ABS is at a different location, the track width as well as the writer nose chisel angle may change. The ABS may change location, for example due to variations in lapping of the transducer 150/head. For example, for the pole 162, the write track width, wtw, is shown for the ABS at the location shown. If, however, the transducer 150 is overlapped, the ABS may be at the location marked by the line 161. In such a case, the write track width would be wtw'. As can be seen in FIG. 2B, these track widths are different. Further, if the transducer 150 is under lapped, then the write track width would be less than wtw.

The transducer 100 is a read transducer. Thus, the transducer 100 includes soft magnetic shields 102 and 108, insulator 104, biasing layers 106, and a read sensor 110. The sensor 110 includes a pinned layer 112, a nonmagnetic spacer layer 114, and a free layer 116. The pinned layer 112 and free layer 116 are ferromagnetic. However, the magnetization of the pinned layer 112 is stable, while that of the free layer 116 may respond to an external magnetic field. The pinned layer 112 is shown as a single layer. However, in some embodiments, the pinned layer 112 may be a multilayer including but not limited to a SAF structure. The free layer 116 is shown as a single layer, but may be a multilayer including but not limited to a SAF structure. The nonmagnetic spacer layer 114 may be a conductor, an insulator such as a tunneling barrier layer, or other similar structure. In some embodiments, therefore, the sensor 110 is a GMR or TMR sensor. However, in the embodiment shown, there is no pinning layer at the ABS. In other embodiments, such a pinning layer may be included. Further, in other embodiments, another type of read sensor and/or other biasing structures (including no biasing structure) might be used.

As can be seen in FIG. 2D, the read sensor 110 has an adaptive track width. Stated differently, the width (also termed the track width) of the sensor 110 recessed from the ABS in the stripe height direction is different from the width of the sensor at the ABS. More specifically, the sensor 110 has a width, tw1, in the track width direction at the ABS. This corresponds to the distance between the sidewalls of a portion of the sensor 110 at the ABS. In some embodiments, it is the distance between the sidewalls at the free layer 116. Recessed a certain distance from the ABS, the sensor 110 has a width tw2. Further from the ABS, the sensor 110 has a width tw3. In the embodiment shown, the width of the sensor 110 increases with increasing distance from the ABS. Also in the embodiment shown, the width increases monotonically with increasing distance from the ABS along the stripe height direction. However, in another embodiment, the width of the read sensor 110 may change in another manner, including decreasing moving in a direction recessed from the ABS instead of increasing. Also in the embodiment shown, the sidewalls of the sensor are substantially linear. Thus, the width of the sensor 110 increases substantially linearly with distance from the ABS. However, in other embodiments, the width of the read sensor may change in a different manner.

In the embodiment shown, the sidewalls of the sensor 110 extend from the ABS at an angle, β, from the stripe height direction. This angle is termed the read sensor angle. In some embodiments, the read sensor angle corresponds to the writer nose chisel angle. For example, the read sensor angle may be desired to be equal to the writer nose chisel angle. Thus, in some embodiments, the reader sensor angle is within two degrees of a target writer nose chisel angle. The target writer nose chisel angle is the designed/desired nose chisel angle for the writer 150. The actual writer nose chisel angle, α, may differ from this desired/target value for reasons including but not limited to processing issues. In some embodiments, the read sensor angle is within ten degrees of the actual writer nose chisel angle. In some such embodiments, the sensor angle is within five degrees of the actual writer nose chisel angle. In still other embodiments, the sensor angle is within two degrees of the actual writer nose chisel angle.

Due to the read sensor 110, the read transducer 100 may have an adaptive track width. More specifically, the track width of the read sensor 110 may change in the stripe height direction. As a result, the track width of the read sensor 110 for the read transducer 100 may better match the write track width of the write transducer 150. For example, as discussed above, the write track width of the write transducer 150 varies based upon the actual location of the ABS. In some embodiments, the write track width increases as the actual location of the ABS moves along the stripe height direction because of the writer nose chisel angle. If the head is overlapped, the write track width may be greater than the target width. If the head is underlapped, the write track width may be less than the target. Because the read sensor 110 also has a width that changes in the stripe height direction, the read sensor track width may better match the write track width. For example, the width of the read sensor 110 may increase from tw1 through tw2 to tw3 if the ABS is moved along the stripe height direction due to overlapping. The read sensor width may also be less than tw1 if the head is underlapped. As a result, the read sensor width may better match the write track width. Further, the read sensor angle may be configured to correspond to the writer nose chisel angle. Thus, the manner in which the read sensor width changes in the stripe height direction may better match the manner in which the write track width changes in the stripe height direction. As a result, this adaptive track width of the read sensor 110 may improve the on track performance for example by enhancing error margin, signal to noise ratio, and overwrite of the read transducer 100. The off track performance of the read sensor 110 may also be improved for example by reduction adjacent track interference and squash. Moreover, this adaptive width of the sensor 110 may be compatible with current fabrication techniques, hard bias architecture, and/or shield architecture. Thus, performance of the read transducer 100 may be improved without significantly complicating fabrication.

FIGS. 3A and 3B depict plan and ABS, respectively, of another exemplary embodiment of a portion of a magnetic read transducer 100'. For clarity, FIGS. 3A-3B are not to scale. The read transducer 100' may be part of a read head or may be part of a merged head that also includes a write transducer 150. Thus, the read transducer 100' may be used in the head depicted in FIG. 2A-2E. FIGS. 3A-3B thus correspond to FIGS. 2D-2E. The head of which the read transducer 100' is a part is part of a disk drive having a media, a slider and the head coupled with the slider. The magnetic read transducer 100' corresponds to the magnetic read transducer 100. Similar components have analogous labels. The magnetic transducer 100' includes shields 102' and 108', nonmagnetic insulating layer 104', sensor 110' having pinned layer 112', nonmagnetic spacer layer 114', and free layer 116', bias layers 106' that correspond to shields 102 and 108, nonmagnetic insulating layer 104, sensor 110 having pinned layer 112, nonmagnetic spacer layer 114, and free layer 116, and bias layers 106, respectively. Thus, the components 102', 104', 106', 108', 110', 112', 114', and 116' have a similar structure and function to the components, 102, 104, 106, 108, 110, 112, 114, 116, and 120, respectively. Further, in other embodiments, another type of read sensor and/or other biasing structures (including no biasing structure) might be used.

As can be seen in FIG. 3A, the read sensor 110' has an adaptive track width. Stated differently, the width of the sensor 110' recessed from the ABS in the stripe height direction is different from the width of the sensor at the ABS. The read sensor 110' has widths tw1' through tw2' and to tw3' that correspond to the widths tw1, tw2, and tw3, respectively. The sensor 110 has a width tw1' in the track width direction at the ABS. Recessed a certain distance from the ABS, the sensor 110 has a width tw2'. Further from the ABS, the sensor 110 has a width tw3'. In the embodiment shown, the width of the sensor 110 increases with increasing distance from the ABS. Also in the embodiment shown, the width increases monotonically with increasing distance from the ABS along the stripe height direction. However, in another embodiment, the width of the read sensor 110 may change in another manner, including decreasing recessed from the ABS instead of increasing.

In the embodiment shown, the sidewalls of the sensor 110' extend from the ABS at an angle, β' from the stripe height direction. In some embodiments, the read sensor angle corresponds to the writer nose chisel angle. For example, the read sensor angle may be desired to be equal to the writer nose chisel angle. Thus, in some embodiments, the reader sensor angle is within two degrees of a target writer nose chisel angle. The target writer nose chisel angle is the designed/desired nose chisel angle for the writer 150. The actual writer nose chisel angle, a, may differ from this desired/target value for reasons including but not limited to processing issues. In some embodiments, the sensor angle is within ten degrees of the actual writer nose chisel angle. In some such embodiments, the sensor angle is within five degrees of the actual writer nose chisel angle. In still other embodiments, the sensor angle is within two degrees of the actual writer nose chisel angle.

In the embodiment shown, the sidewalls of the sensor 110 are curved. Thus, the width of the sensor 110 increases with distance from the ABS along this curve. In some embodiments, the curvature of the sidewalls may match the curvature of at least a portion of the pole 162 depicted in FIG. 2B. Due to the read sensor 110', the read transducer 100' may have an adaptive track width that changes along the stripe height direction. As a result, the track width of the read sensor 110' for the read transducer 100' may better match the write track width of the write transducer 150. For example, both the width of the sensor 110' and the write track width of the transducer 150 may increase with overlapping (recessed from the ABS shown) and decrease with underlapping (further from the ABS shown). As a result, the read sensor width may better match the write track width. Further, the read sensor angle may be configured to correspond to the writer nose chisel angle. Thus, the manner in which the read sensor width changes in the stripe height direction may better match the manner in which the write track width changes in the stripe height direction. As a result, this adaptive track width of the read sensor 110' may improve the performance of the read transducer 100'. Moreover, this adaptive width of the sensor 110' may be compatible with current fabrication techniques, hard bias architecture, and/or shield architecture. Thus, performance of the read transducer 100' may be improved without significantly complicating fabrication.

FIGS. 4A and 4B depict plan and ABS, respectively, of another exemplary embodiment of a portion of a magnetic read transducer 100". For clarity, FIGS. 4A-4B are not to scale. The read transducer 100" may be part of a read head or may be part of a merged head that also includes a write transducer 150. Thus, the read transducer 100' may be used in the head depicted in FIG. 2A-2E. FIGS. 4A-4B thus correspond to FIGS. 2D-2E. The head of which the read transducer 100' is a part is part of a disk drive having a media, a slider and the head coupled with the slider. The magnetic read transducer 100" corresponds to the magnetic read transducers 100 and 100'. Similar components have analogous labels. The magnetic transducer 100" includes shields 102" and 108", nonmagnetic insulating layer 104", sensor 110" having pinned layer 112", nonmagnetic spacer layer 114", and free layer 116", bias layers 106" that correspond to shields 102/102' and 108/108', nonmagnetic insulating layer 104/104', sensor 110/110' having pinned layer 112/112', nonmagnetic spacer layer 114/114', and free layer 116/116', and bias layers 106/106', respectively. Thus, the components 102", 104", 106", 108", 110", 112", 114", 116", and 120" have a similar structure and function to the components, 102/102', 104/104', 106/106', 108/108', 110/110', 112/112', 114/114', 116/116', and 120/120', respectively. Further, in other embodiments, another type of read sensor and/or other biasing structures (including no biasing structure) might be used.

As can be seen in FIG. 4A, the read sensor 110" has an adaptive track width. Stated differently, the width of the sensor 110" recessed from the ABS in the stripe height direction is different from the width of the sensor at the ABS. The read sensor 110" has widths tw1" through tw2" and to tw3" that correspond to the widths tw1/tw', tw2/tw2', and tw3/tw3', respectively. The sensor 110' has a width tw1" in the track width direction at the ABS. Recessed a certain distance from the ABS, the sensor 110" has a width tw2". Further from the ABS, the sensor 110 has a width tw3". In the embodiment shown, the width of the sensor 110 increases with increasing distance from the ABS. Also in the embodiment shown, the width increases monotonically with increasing distance from the ABS along the stripe height direction. However, in another embodiment, the width of the read sensor 110 may change in another manner, including decreasing recessed from the ABS instead of increasing.

In the embodiment shown, the sidewalls of the sensor 110" extend from the ABS at an angle, β" from the stripe height direction. In some embodiments, the read sensor angle corresponds to the writer nose chisel angle. For example, the read sensor angle may be desired to be equal to the writer nose chisel angle. Thus, in some embodiments, the reader sensor angle is within two degrees of a target writer nose chisel angle. The target writer nose chisel angle is the designed/desired nose chisel angle for the writer 150. The actual writer nose chisel angle, a, may differ from this desired/target value for reasons including but not limited to processing issues. In some embodiments, the sensor angle is within ten degrees of the actual writer nose chisel angle. In some such embodiments, the sensor angle is within five degrees of the actual writer nose chisel angle. In still other embodiments, the sensor angle is within two degrees of the actual writer nose chisel angle.

In the embodiment shown, the sidewalls of the sensor 110" are formed of line segments. Thus, the width of the sensor 110" increases with distance from the ABS in a piece-wise linear fashion. In some embodiments, the line segments of the sidewalls may be configured to better match the curvature of at least a portion of the pole 162 depicted in FIG. 2B than a single line. Due to the read sensor 110", the read transducer 100" may have an adaptive track width that changes along the stripe height direction. As a result, the track width of the read sensor 110" for the read transducer 100" may better match the write track width of the write transducer 150. For example, both the width of the sensor 110" and the write track width of the transducer 150 may increase with overlapping (recessed from the ABS shown) and decrease with underlapping (further from the ABS shown). As a result, the read sensor width may better match the write track width. Further, the read sensor angle may be configured to correspond to the writer nose chisel angle. Thus, the manner in which the read sensor width changes in the stripe height direction may better match the manner in which the write track width changes in the stripe height direction. As a result, this adaptive track width of the read sensor 110" may improve the performance of the read transducer 100". Moreover, this adaptive width of the sensor 110" may be compatible with current fabrication techniques, hard bias architecture, and/or shield architecture. Thus, performance of the read transducer 100" may be improved without significantly complicating fabrication.

FIGS. 5A and 5B depict plan and ABS, respectively, of another exemplary embodiment of a portion of a magnetic read transducer 100'''. For clarity, FIGS. 5A-5B are not to scale. The read transducer 100''' may be part of a read head or may be part of a merged head that also includes a write transducer 150. Thus, the read transducer 100'' may be used in the head depicted in FIG. 2A-2E. FIGS. 5A-5B thus correspond to FIGS. 2D-2E. The head of which the read transducer 100' is a part is part of a disk drive having a media, a slider and the head coupled with the slider. The magnetic read transducer 100'' corresponds to the magnetic read transducers 100, 100', and 100''. Similar components have analogous labels. The magnetic transducer 100''' includes shields 102''' and 108''', nonmagnetic insulating layer 104''', sensor 110''' having pinned layer 112''', nonmagnetic spacer layer 114''', and free layer 116''', bias layers 106''' that correspond to shields 102/102'/102'' and 108/108'/108'', nonmagnetic insulating layer 104/104'/104'', sensor 110/110'/110'' having pinned layer 112/112'/112'', nonmagnetic spacer layer 114/114'/114'', and free layer 116/116'/116'', and bias layers 106/106'/106'', respectively. Thus, the components 102''', 104''', 106''', 108''', 110''', 112''', 114''', 116''', and 120''' have a similar structure and function to the components 102/102'/102'', 108/108'/108'', 104/104'/104'', 110/110'/110'', 112/112'/112'', 114/114'/114'', 116/116'/116'', and 106/106'/106'', respectively. Further, in other embodiments, another type of read sensor and/or other biasing structures (including no biasing structure) might be used.

As can be seen in FIG. 5A, the read sensor 110''' has an adaptive track width. Stated differently, the width of the sensor 110''' recessed from the ABS in the stripe height direction is different from the width of the sensor at the ABS. The read sensor 110''' has widths tw1''' through tw2''' that correspond to the widths tw1/tw/tw'', tw2/tw2'/tw2', and tw3/tw3'/tw3', respectively. The sensor 110''' has a width tw1''' in the track width direction at the ABS. Recessed a certain distance from the ABS, the sensor 110''' has a width tw2'''. In the embodiment shown, the width of the sensor 110''' increases with increasing distance from the ABS. In the embodiment shown, the sidewalls of the sensor 110' are formed of line segments that are alternately perpendicular and parallel to the ABS. Also in the embodiment shown, the width increases in a step-wise fashion with increasing distance from the ABS along the stripe height direction. However, in another embodiment, the width of the read sensor 110''' may change in another manner, including decreasing recessed from the ABS instead of increasing. In addition, in another embodiment, another number of steps could be used.

Due to the read sensor 110''', the read transducer 100''' may have an adaptive track width that changes along the stripe height direction. As a result, the track width of the read sensor 110''' for the read transducer 100''' may better match the write track width of the write transducer 150. As a result, this adaptive track width of the read sensor 110''' may improve the performance of the read transducer 100'''. Moreover, this adaptive width of the sensor 110''' may be compatible with current fabrication techniques, hard bias architecture, and/or shield architecture. Thus, performance of the read transducer 100''' may be improved without significantly complicating fabrication.

Figure 6:
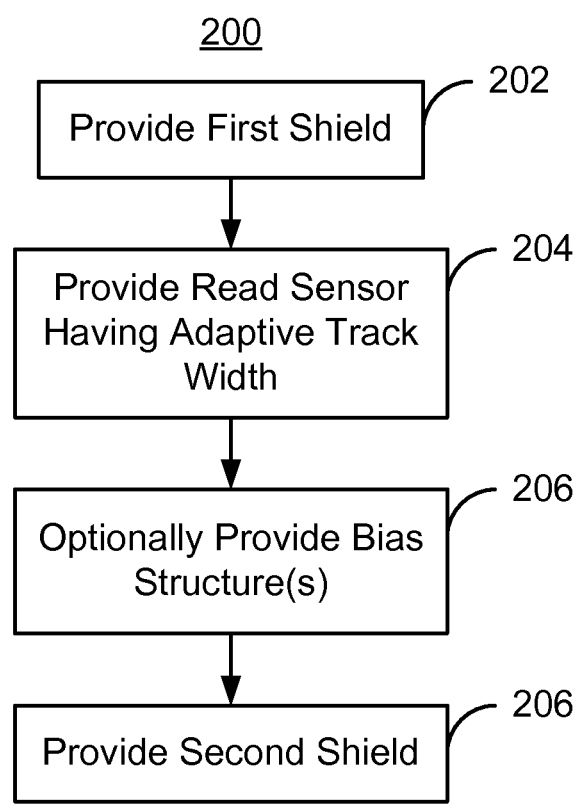
FIG. 6 is flow chart depicting an exemplary embodiment of a method for fabricating a portion of a magnetic recording read transducer.

FIG. 6 is an exemplary embodiment of a method 200 for providing a read transducer having a sensor with an adaptive track width. For simplicity, some steps may be omitted, interleaved, and/or combined. The method 200 is also described in the context of providing a single recording transducer 100. However, the method 200 may be used to fabricate multiple transducers at substantially the same time. The method 200 may also be used to fabricate other transducers including but not limited to any combination of 100, 100', 100'', and 100'''. Further, the method 200 may be part of a method for providing a head and/or disk drive that also incorporates a write transducer such as the write transducer 150. The method 200 is also described in the context of particular layers. A particular layer may include multiple materials and/or multiple sublayers. The method 200 also may start after formation of other portions of the magnetic recording transducer.

The shield 102 is provided, via step 202. Step 202 typically includes depositing a large high permeability layer. The shield 102 typically extends significantly further in the track width direction than the read sensor 110 or any bias structures 106. The sensor 110 having an adaptive track width is provided, via step 204. Step 204 typically includes depositing the layers for the sensor 110. The sensor 110 may also be defined from the sensor stack in at least the track width direction in step 204. In some embodiments, the read sensor 110 is defined performed using an ion mill. In some embodiments, the sensor 110 is also defined in the stripe height direction. In some embodiments, the at least some of the layers for the sensor are not completely milled through in the stripe height direction to provide an extended layers. Further, the mask(s) and other processes used to define the read sensor 110 are configured such that the width of the read sensor 110 changes along the stripe height direction.

The bias structures 106 may optionally be provided in step 206. Step 206 may include depositing hard bias or other analogous structures. The top shield 108 may then be provided, via step 208. Formation of the transducer 100 may then be completed.

Using the method 200, the transducers 100, 100', 100'', 100''' and/or analogous read transducers may be fabricated. Thus, the benefits of one or more of the transducers 100, 100', 100'', and/or 100''' may be achieved.

We claim:

1. A magnetic read transducer having an air-bearing surface (ABS) and being coupled with a writer including a pole having writer nose chisel angle, the magnetic read transducer comprising:
   a first shield;
   a second shield; and
   a read sensor between the first shield and the second shield, the read sensor extending along a stripe height direction perpendicular to the ABS and having at least one sidewall extending from the ABS at an angle from the stripe height direction, a first portion of the read sensor at the ABS having a first width in a track width direction parallel to the ABS, a second portion of the read sensor recessed from the ABS along the stripe height direction and having a second width in the track width direction, the second width being greater than the first width, wherein the angle corresponds to the writer nose chisel angle, wherein the writer nose chisel angle is an actual writer nose chisel angle and wherein the angle is within ten degrees of the actual writer nose chisel angle.

2. The magnetic read transducer of claim 1 wherein the read sensor has a width increasing monotonically with increasing distance from the ABS along the stripe height direction.

3. The magnetic read transducer of claim 1 wherein the at least one sidewall extends from the ABS such that the second width is greater than the first width.

4. The magnetic read transducer of claim 3 wherein the at least one sidewall is curved.

5. The magnetic read transducer of claim 3 wherein the at least one sidewall includes a plurality of substantially linear segments.

6. The magnetic read transducer of claim 3 wherein the at least one sidewall is substantially linear.

7. The magnetic read transducer of claim 1, wherein the angle is within two degrees of a target writer nose chisel angle.

8. The magnetic read transducer of claim 1 wherein the angle is within five degrees of the actual writer nose chisel angle.

9. The magnetic read transducer of claim 1 wherein the angle is within two degrees of the actual writer nose chisel angle.

10. A magnetic recording head having an air-bearing surface (ABS) comprising:
a write transducer including a pole having a pole tip, a portion of the pole tip having a surface residing at the ABS and having a plurality of pole sidewalls extending from the ABS at a nose chisel angle from a stripe height direction, the nose chisel angle corresponding to an actual writer nose chisel angle; and
a read transducer coupled with the write transducer and including a first shield, a second shield, and a read sensor between the first shield and the second shield, the read sensor having a plurality of sidewalls and extending along the stripe height direction perpendicular to the ABS, a first portion of the read sensor at the ABS having a first width in a track width direction parallel to the ABS, a second portion of the read sensor recessed from the ABS along the stripe height direction having a second width in the track width direction, the second width being greater than the first width, the plurality of sidewalls extending from the ABS at a read sensor angle from the stripe height direction, the read sensor angle is within ten degrees of the actual writer nose chisel angle.

11. A disk drive comprising:
at least one disk;
at least one slider including at least one magnetic read transducer having an air-bearing surface (ABS) and a write transducer having the ABS, the write transducer including a pole having a pole tip, a portion of the pole tip having a surface residing at the ABS and having a plurality of pole sidewalls extending from the ABS at a nose chisel angle from a stripe height direction, the nose chisel angle corresponding to an actual writer nose chisel angle, the read transducer coupled with the write transducer and including a first shield, a second shield, and a read sensor between the first shield and the second shield, the read sensor having a plurality of sidewalls and extending along the stripe height direction perpendicular to the ABS, a first portion of the read sensor at the ABS having a first width in a track width direction parallel to the ABS, a second portion of the read sensor recessed from the ABS along the stripe height direction having a second width in the track width direction, the second width being greater than the first width, the plurality of sidewalls extending from the ABS at a read sensor angle from the stripe height direction, the read sensor angle is within ten degrees of the actual writer nose chisel angle.

12. A method for providing a magnetic read transducer having an air-bearing surface (ABS) and being coupled with a writer including a pole having a writer nose chisel angle, the method comprising:
providing a first shield;
providing a second shield; and
providing a read sensor between the first shield and the second shield, the read sensor extending along a stripe height direction perpendicular to the ABS and having at least one sidewall extending from the ABS at an angle from the stripe height direction, a first portion of the read sensor at the ABS having a first width in a track width direction parallel to the ABS, a second portion of the read sensor recessed from the ABS along the stripe height direction and having a second width in the track width direction, the second width being greater than the first width, wherein the angle corresponds to the writer nose chisel angle, wherein the writer nose chisel angle is an actual writer nose chisel angle and wherein the angle is within ten degrees of the actual writer nose chisel angle.

13. The method of claim 12 wherein the step of providing the read sensor further includes:
depositing a read sensor stack corresponding to the read sensor; and
defining the read sensor from the read sensor stack in a track width direction such that the read sensor has a width increasing monotonically with increasing distance from the ABS along the stripe height direction.

14. The method of claim 12 wherein the at least one sidewall extends from the ABS such that the second width is greater than the first width.

15. The method of claim 12, wherein the angle is within two degrees of a target writer nose chisel angle.

16. The method of claim 12 wherein the angle is within five degrees of the actual writer nose chisel angle.

17. The method of claim 12 wherein the angle is within two degrees of the actual writer nose chisel angle.

\* \* \* \* \*